– – –
United States Patent [19]

Schneider et al.

[11] 4,388,095

[45] Jun. 14, 1983

[54] METHOD OF PRODUCING A GLASS LAYER ON AN INTERIOR SURFACE OF A HOLLOW BODY

[75] Inventors: Hartmut Schneider; Egon Lebetzki, both of Munich, Fed. Rep. of Germany

[73] Assignee: Siemens Aktiengesellschaft, Berlin & Munich, Fed. Rep. of Germany

[21] Appl. No.: 284,103

[22] Filed: Jul. 16, 1981

[30] Foreign Application Priority Data

Jul. 21, 1980 [DE]  Fed. Rep. of Germany ....... 3027592

[51] Int. Cl.³ ..................... C03B 37/075; C03C 17/02
[52] U.S. Cl. ...................................... 65/18.2; 65/3.12; 65/60.8; 427/163; 427/237
[58] Field of Search .................. 65/3.12, 3.2, 18.2, 65/32, 60.1, 60.8; 427/163, 237

[56] References Cited

U.S. PATENT DOCUMENTS 3,791,714  2/1974  Maurer ............................ 65/3.12 X
4,235,616 11/1980  Siegfried ............................. 65/3.12
4,310,340  1/1982  Sarkar ................................. 65/3.12

OTHER PUBLICATIONS

P. C. Schultz, Applied Optics, vol. 18, (1979) pp. 3684–3693.
Survey Papers, XIth Intern. Congr. Glass, vol. II, (Prague 1977), pp. 114–157.
T. Akamatsu et al., Applied Physics Letters, vol. 31, (1977) pp. 174–176.

*Primary Examiner*—Richard V. Fisher
*Attorney, Agent, or Firm*—Hill, Van Santen, Steadman, Chiara & Simpson

[57] ABSTRACT

Glass preforms useful for producing optical fibers therefrom are produced by forming at least one layer of glass on an inner surface of a hollow glass tube by introducing a reactive gas mixture suitable for glass synthesis (ie., $SiCl_4$, $GeCl_4$, etc., and $O_2$) and a combustible heating gas mixture (ie., CO, $C_2N_2$, $CS_2$, $C_4N_2$, COS, $C_3O_2$, etc., and $O_2$) into a hot region within the hollow tube which is generated by exterior heating of such tube. The reactive gas undergoes a chemical reaction at such hot region whereby a material having the composition of glass is deposited on the hot inner surface of the tube as a layer and melts into a clear glass film while the heating gas combusts at the hot region and aids the rate of glass formation on the inner surface of the tube.

10 Claims, No Drawings

METHOD OF PRODUCING A GLASS LAYER ON AN INTERIOR SURFACE OF A HOLLOW BODY

BACKGROUND OF THE INVENTION

1. Field of the Invention

The invention relates to a method of producing a glass layer and somewhat more particularly to a method of producing a glass layer on an interior surface of a hollow body by thermal decomposition of a reactive gas mixture suitable for glass synthesis.

2. Prior Art

Methods of producing a glass layer on an inner surface of a hollow body, such as a tube, wherein a suitable reactive gas mixture for glass synthesis is introduced into a hot region within the interior of such body and generated by external heating of the body so that a chemical reaction occurs at the hot region and a material having the composition of glass is generated from the gas mixture and is deposited on the inner surface of the body as a layer which is then melted and fused to form a clear glass film, are known.

These type of production methods are used, for example, to produce high purity glass preforms useful in production of glass fiber lightwave guides and are sometimes referred to as CVD (chemical vapor deposition) techniques (see, for example, Survey Papers, XIth Intern. Congr. Glass, Vol. II, Prague, 1977, pages 114–157; Chem. Eng. Techn., Vol. 51, 1979, pages 612–627 and Appl. Opt., Vol. 18, 1979, pages 3684–3693 wherein there is presented a detailed comparison of different known production techniques).

In general, with the CVD technique, a reactive gas mixture suitable for glass synthesis is introduced into a hollow glass tube, generally composed of high purity quartz glass. The reactive gas mixture is comprised, in general, of gaseous halides and oxygen. The glass tube is heated on its exterior surface by a suitable furnace or burner, for example, a hydrogen burner, so that a localized hot region is generated in the interior of the tube which also encompasses a corresponding hot interior surface of such tube. Within this hot region, the introduced halides are combusted. The oxides or oxide mixtures which are so-generated collect or are deposited as a powdery or glassy material on the inner surface of the tube as a layer which is then melted into a clear glass film in the hot region. As a rule, the burners used only heat a relatively short piece of a tube over its entire circumference. In coating longer lengths of a tube, a burner is moved relative to the tube so that the local hot region in the interior of the tube gradually travels along the length of the tube and the inner surface or wall along this length is uniformly coated with a layer of synthetic glass. By repeating this coating process a plurality of times, several glass layers can be generated one on top of another on the inner surface of a tube. A tube coated in this manner is then shaped into a solid rod and thus a blank workpiece or perform for glass fiber lightwave guides is attained. Glass fibers are pulled from this rod-shaped workpiece in a conventional manner to form lightwave guides.

The CVD technique produces coated glass tubes or preforms of especially high purity from which glass fiber lightwave guides can be attained and which exhibit excellent quality, particularly extremely low attenuation with simultaneously high band widths. Tubes heated by flames yield lightwave guides having particularly low attenuation values.

However, a limitation of the CVD technique is that it is capable of only a relatively slow glass formation rate. Generally, it is slower by a factor of 5 to 15 relative to other known methods and thus leads to correspondingly low production rates. A reason for such relatively low glass formation rate is that with the CVD method, the layer of material must be deposited on an inner wall and substantially simultaneously be melted or sintered into clear glass. The sintering velocity thus determines the glass formation rate. However, the permissible sintering velocity is limited. As experience has shown, sintering too fast leads to bubbled glass.

A suggested technique for increasing sintering velocity and thus glass formation rate comprises, according to Appl. Phys. Lett., Vol. 31, 1977, pages 174–176, adding helium to the gas mixture introduced into a tube. With this technique, five times thicker powder coatings should be meltable, relative to a coating meltable with a customary gas mixture.

SUMMARY OF THE INVENTION

The invention provides an improved method of producing a glass layer on an inner surface of a hollow body whereby glass formation rate is effectively raised in a manner different from the heretofore known techniques. In accordance with the principles of the invention, a combustible heating gas, along with a reactive gas, is introduced to the localized hot interior region of a hollow body so as to ignite and combust at such region and heat the glass-forming material layer deposited within the tube on a side of such layer opposite from that being heated by the exterior burner.

A significant advantage stemming from the practice of the principles of the invention is that not only very high sintering velocities and glass formation rates are attained (compared to conventional CVD techniques, five times greater glass formation rates can be attained), but also that the thicker glass layers which are generated exhibit the same quality as is attained with conventional CVD techniques.

The heating gas mixture provided in accordance with the principles of the invention ignites on the hot inner wall of an exteriorly heated tube and burns in the tube interior so as to effectively support the indirect heating of a deposited glass-forming layer from the outside thereof. An overheating of a glass tube caused by the low thermal conductivity of a glass tube wall, as well as an overheating of the deposited layer itself, is thereby avoided.

Raising the temperature of a reactive gas mixture by the combustion of a heating gas mixture in the tube favorably influences the efficiency of the chemical reaction by the reactive gas and also favorably influences the efficiency of the material deposition on the interior surface of the tube. The high glass formation rate attainable with the principles of the invention resembles high glass formation rates previously attainable with material growth on exterior surfaces of a rod by chronologically separating the deposition and sintering processes from one another.

A further significant advantage of the invention is that the relatively thick layer of glass-forming material attained by the high deposition rate on the inner surface of a hollow body, can be completely melted through so that individually thick glass layers and thus a plurality of such thicker glass layers can be generated. The invention is thus particularly useful for producing thick preforms or workpieces for glass fiber lightwave guides.

In a preferred embodiment of the invention, a hydrogen-free heating gas mixture is utilized. With this embodiment, synthetic glass with particularly good optical quality can be attained. In this embodiment a heating gas mixture useful in the practice of the invention is comprised of an admixture of a gas selected from the group consisting of carbon monoxide (CO), dicyanogen ($C_2N_2$), carbon disulfide ($CS_2$), carbon oxysulfide (COS) or mixtures thereof and oxygen.

In another embodiment, a heating gas mixture useful in the practice of the invention comprises an admixture of a halide, preferably chloride, and a hydrogen-containing gas so that during combustion of such gas mixture, a hydrogen halide (ie., hydrogen chloride) is formed, rather than water.

In yet other embodiments, a heating gas mixture useful in the practice of the invention can include at least one deuterated hydrocarbon gas. Preferably, such deuterated gas is selected from the group consisting of tetradeuteromethane, dideuteroazethylene and mixtures thereof.

In a preferred embodiment of the invention, a localized hot region is generated within the interior of a hollow body and is controllably displaced relative to the body so as to traverse a select length of the body and thus generate a glass layer along such traversed length.

It is particularly advantageous in the practice of the invention to add a material functioning as a flame inhibitor to a selected heating gas mixture. With this addition, the heating gas mixture only burns in the localized hot region in the interior of the hollow body. Further, a flashback of the flame out of the hot region, which can be dangerous under certain circumstances, is avoided. Also, a flashback can travel to a heating gas mixture burning outside of the hollow body and/or not reaching the hot region in the interior of the body at all. Especially in instances where a travelling localized hot region is present, the addition of a flame-inhibiting material is recommended. By following this recommendation, the flame of a combustible heating gas mixture remains localized to the hot region, travels therewith and, in addition, aids in providing very uniform layer thicknesses for the individually generated glass layers.

A material functioning as a flame inhibitor preferably includes a gaseous halide.

It is known that chloride compounds function as flame inhibitors. In the practice of conventional CVD techniques, in general, chloride compounds, such as for example, silicon tetrachloride or germanium tetrachloride, are used within the reactive gas mixtures. In the practice of the invention, since these compounds function as flame inhibitors, they can, in addition to being added to reactive gas mixture, also be added as such to a heating gas mixture.

In the practice of the invention, substances which function as flame inhibitors can be employed as one of the reactive partners of the reactive gas mixture. In fact, it is advantageous and practical to introduce a reactive gas mixture and a heating gas mixture admixed with one another into a hot region within a hollow body. The admixing can occur before introduction into the hot region or thereafter.

DESCRIPTION OF PREFERRED EMBODIMENTS

With the foregoing summary discussion in mind, we now present detailed examples and further relevant discussion which will further illustrate to those skilled in the art the manner in which the invention is carried out. However, the examples are not to be construed as limiting the scope of the invention in any way.

A plurality of quartz glass tubes, each being of 600 mm length were coated via the process of the invention. The tubes either have an outside diameter of 20 to 30 mm and an interior diameter of 17 or 28 mm. The size of the respective tubes is identified in Table 1 below. For the coating process, each tube was mounted horizontally in a glass-turning lathe. A hydrogen burner was operationally positioned next to the lathe for heating each of the tubes from the outside about the circumference thereof, while the tubes rotated at a rotational speed of 1 revolution per second about its longitudinal axis. In this manner, the hydrogen burner heated a localized region of each tube over its entire circumference. The burner was moved at an advancing velocity of 15 cm/min along the longitudinal direction of the tube. The temperature of the heated tube region was scanned with an IR-radiation pyrometer and was kept relatively constant via controlled combustion gas feeding valves and was maintained at 1560° to 1800° C.±0.3%.

The reactive gas mixture was comprised of $SiCl_4$ gas, $GeCl_4$ gas and $O_2$ and the combustible heating gas mixture was comprised of CO gas and $O_2$ gas. The reactive gas mixture and the heating gas mixture were mixed with one another and introduced from an end into each respective tube. The flow velocity of the respective gas mixtures and thus the gas flow rate through the tube was controlled via the pressure of each respective gas mixture.

The reactive gas mixture was produced by bubbling controlled oxygen streams through thermostat-equipped vaporization containers. These containers were dimensioned such that an approximately 100% loading of the oxygen stream with moisture took place. The loading was precalculated for small oxygen streams of about 100 Nml/min by noting the weight increase of two post-connected sodium hydroxide solution wash bottles.

The same precautions were taken to insure the purity of the heating gas mixture as described above for the reaction gas mixture. Quality of the synthetic glass must be as pure as possible. The oxygen gas for the heating and the reactive gas mixtures was taken from an identical source. The carbon monoxide gas was a commercially obtainable gas which had a purity of 99.997% (available the Linde Company, Munich, Germany).

In total, thirty quartz glass tubes were coated on their respective interiors with several glass layers utilizing the parameters just described. The relevant data is set forth in Table 1, below. In the Table, $V(O_2)$, $V(CO)$, $V(SiCl_4)$, $V(GeCl_4)$ signify the respective flow rates of the $O_2$, Co, $SiCl_4$ and $GeCl_4$ gases through a given tube. $\Sigma V$ denotes the total flow rate of the total gas mixture through a given tube. The flow rates are stated in terms of Nml/min. Y denotes a stoichiometric parameter which is defined by $Y=X(O_2)/(X(SiCl_4)+X(GeCl_4)+X(CO)/2)$, whereby $X(i)$ with $I=O_2$, $SiCl_4$, $GeCl_4$ or, respectively, CO, denotes the molar fraction of the gas set forth in the parentheses. $Y>1$ denotes an oxygen excess, Y<1 denotes an oxygen deficiency and Y=1 signifies a stoichiometric gas mixture whereat, as is known, combustion is the hottest. 1 states the number of generated individual glass layers in a given tube and $V_F$ indicates the actually attained glass formation rate, measured in cm³/min.

TABLE 1

| Nr. | V(O₂) | V(CO) | V(SiCl₄) | V(GeCl₄) | ΣV | Y | X(SiCl₄) | l | $V_f$ |
|---|---|---|---|---|---|---|---|---|---|
|   | Nml/min | | | | | | | | cm³/min |
| 1 | 1056 | 0 | 90 | 21 | 1170 | 9.51 | 0.077 | 10 | 0.061 |
| 2 | 1056 | 50 | 90 | 21 | 1220 | 7.77 | 0.074 | 10 | 0.059 |
| 3 | 4210 | 0 | 90 | 21 | 4320 | 37.9 | 0.021 | 6 | 0.040 |
| 4 | 4210 | 640 | 90 | 21 | 4960 | 9.76 | 0.018 | 6 | 0.037 |
| 5 | 2710 | 0 | 90 | 21 | 2820 | 24.4 | 0.032 | 6 | 0.047 |
| 6 | 2710 | 640 | 90 | 21 | 3460 | 6.28 | 0.026 | 6 | 0.043 |
| 7 | 2710 | 940 | 90 | 21 | 3750 | 4.66 | 0.024 | 6 | 0.037 |
| 8 | 2710 | 1870 | 90 | 21 | 4690 | 2.58 | 0.019 | 3 | 0.036 |
| 9 | 2710 | 2200 | 430 | 110 | 5440 | 1.65 | 0.079 | 5 | 0.093 |
| 10 | 2710 | 2200 | 860 | 220 | 5980 | 1.24 | 0.144 | 5 | 0.161 |
| 11 | 3000 | 2200 | 860 | 0 | 6060 | 1.53 | 0.142 | 9 | — |
| 12 | 3000 | 2200 | 860 | 700 | 6760 | 1.13 | 0.127 | 10 | 0.169 |
| 13 | 3500 | 2100 | 840 | 420 | 6960 | 1.52 | 0.121 | 3 | 0.169 |
| 14 | 3000 | 2100 | 840 | 420 | 6360 | 1.30 | 0.132 | 3 | 0.171 |
| 15 | 2500 | 2100 | 840 | 420 | 5860 | 1.08 | 0.143 | 3 | 0.180 |
| 16 | 1750 | 1050 | 420 | 210 | 3430 | 1.52 | 0.122 | 3 | 0.118 |
| 17 | 1500 | 1050 | 420 | 210 | 3180 | 1.30 | 0.132 | 3 | 0.119 |
| 18 | 1250 | 1050 | 420 | 210 | 2930 | 1.08 | 0.143 | 3 | 0.154 |
| 19 | 180 | 660 | 420 | 120 | 2200 | 1.1 | 0.191 | 3 | 0.155 |
| 20 | 840 | 402 | 420 | 140 | 1800 | 1.1 | 0.233 | 3 | 0.160 |
| 21 | 695 | 144 | 420 | 140 | 1400 | 1.1 | 0.300 | 3 | 0.169 |
| 22 | 950 | 690 | 420 | 140 | 2200 | 1.05 | 0.191 | 3 | 0.162 |
| 23 | 920 | 720 | 420 | 140 | 2200 | 1.0 | 0.191 | 3 | 0.163 |
| 24 | 890 | 754 | 420 | 140 | 2200 | 0.95 | 0.191 | 3 | 0.161 |
| 25 | 1590 | 1100 | 840 | 56 | 3580 | 1.1 | 0.25 | 3 | 0.220 |
| 26 | 2647 | 1385 | 1260 | 84 | 5380 | 1.3 | 0.25 | 3 | 0.265 |
| 27 | 3176 | 2200 | 1260 | 84 | 6720 | 1.3 | 0.20 | 3 | 0.255 |
| 28 | 1032 | 0 | 140 | 28 | 1200 | 6.1 | 0.117 | 2 | 0.085 |
| 29 | 2650 | 1385 | 1260 | 0 | 5300 | 1.4 | 0.238 | 12 | 0.273 |
| 30 | 1000 | 0 | 28 | 4 | 1032 | 31 | 0.027 | 6 | — |

The diameter of tubes 25–30 was 30 mm outside and 28 mm inside.
The diameter of all other tubes was 20 mm outside and 17 mm inside.

From the data set forth in the above Table, as one of the most important results, it can be seen that glass formation rates, $V_F$, of approximately 0.27 cm³/min can be attained with the practice of the invention and specific with tubes No. 26 and 29 such glass formation rates were attained. Further, the data in Table 1 shows that the glass formation rate increases with the rate of flow, V(SiCl₄), of the silicon tetrachloride gas and decreases with increasing total flow rate, ΣV.

In addition, the following observations were made from the data presented: only when Y<1.5 was it possible to attain bubble-free glass layers with high glass formation rate. Also, the molar fraction, X(SiCl₄), for silicon tetrachloride gas cannot exceed the value 0.25 because otherwise SiCl₄ condensed out at room temperature in the conduit system. Further, the SiO₂ glass yield dropped, both with the flow rate V(SiCl₄) as well as with the total flow rate ΣV. Accordingly, the glass yield, η, can therefore be defined by the relation: $\eta = V_f/V_{f,M}$ wherein $$V_{f,M} = V(SiCl_4) \times \frac{\rho(SiCl_4)}{\rho(SiO_2)} \times \frac{M(SiO_2)}{M(SiCl_4)}$$

which signifies the maximum possible glass formation rate. In this formula, $\rho(SiCl_4)$ or, respectively, $\rho(SiO_2)$ denotes the densities of the material in the parentheses and $M(SiCl_4)$ or, respectively, $M(SiO_2)$ denotes the molar masses of the materials in the parentheses.

An obvious assumption that lowering of the yield with increased total flow rate, ΣV, can be brought about by increased linear gas velocity in the tube was not confirmed. The causes of this are to be sought elsewhere.

Tube No. 10 in Table 1 above, was worked into a workpiece or preform for a multi-mode-step-index-profiled fiber having a SiO₂ jacket and a SiO₂-GeO₂ core. The workpiece had a length of approximately 22 cm, a total diameter of 10 mm±1 mm and a ratio between the diameter of the core and the total diameter of about 0.36. To attain this ratio, only 10 core glass layers were required, instead of 30 as previously. The difference in refraction between the core glass and the jacket glass was measured with an Abbe refractometer and was 0.035, which corresponds to a germanium dioxide concentration in the core of approximately 4 wt.%.

The above-described preform or workpiece was positioned in an operational graphite induction furnace and an optical fiber having a length of approximately 630 m was drawn in a conventional manner. The total diameter of the so-produced fiber was approximately 0.125 mm. The ratio between the core diameter and total diameter in the fiber, was, as with the workpiece, 0.36 and the refractive difference between the core glass and jacket glass at 0.035 was also preserved.

In a spectral range below 720 nm, the above-described fiber displayed a very low attenuation. With a wavelength of 630 nm, an attenuation of 7.0±0.4 dB/km resulted. This is an extremely low value, if not the lowest attenuation value which has ever been observed on a multi-mode glass fiber.

Further measurements of relevant characteristics indicated that the fiber material was extremely homogeneous throughout the scattering coefficient, A, measured on the fiber was extremely low at 1.1 $\mu m^4$ dB/km.

The core glass of the fiber proved to be free of admixtures with absorption bands in the visible spectral range or wide absorption bands in the ultraviolet spectral range.

A rod-shaped preform was produced from internally coated tube No. 29 in Table 1 above, for manufacture of a single mode fiber. For this, the 12 layers of $SiO_2$ glass which were deposited in tube 29 were used as a jacket glass of the fiber. Onto these twelve layers, according to conventional CVD techniques, (ie., without additional interior heating), a $GeO_2$-doped $SiO_2$ glass was deposited as a core glass. In the production of jacket glass layers according to conventional CVD techniques without interior heating, instead of 12 layers, 60 layers would have had to be deposited in order to attain a jacket thickness sufficient for low-attenuation lightwave guiding.

By working the above-described coated tube, a rod was formed which provided a preform for the desired single mode fiber. The rod had a length of approximately 25 cm, with a jacket diameter of 10.3±0.1 mm and the ratio between core diameter and jacket diameter was 0.080±0.008. The refractive index difference between the core glass and jacket glass was estimated to be 0.039 based on measurements of the $GeO_2$ content of the glass with an electron microprobe.

The above-described preform was placed in an operational graphite resistance furnace having a zirconium oxide-muffle tube and an approximately 305 m long fiber having a jacket diameter of 0.080 mm was drawn in a conventional manner. The ratio between core diameter and jacket diameter as well as the refractive index difference had the same values as with the preform. From this last described preform, another fiber was similarly drawn and had a length of about 213 m and a somewhat smaller jacket diameter of 0.070 mm. The ratio between the core diameter and the jacket diameter and the refractive index difference between the core glass and the jacket glass had the same value as in the preform.

Both of the above-described fibers had single mode characteristics. The minimum attenuation of both fibers was measured between 700 and 800 nm and amounted to 3 dB/km. The thicker of the two fibers was more light-permeable.

During measurement of pulse response, it turned out that the thicker of the two fibers, after 300 m, and the thinner fiber after 200 m of fiber length still only carried the basic mode.

All three fibers produced were otherwise also provided with a plastic jacket and all measurements on the fibers were carried out on the plastic-coated fibers.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto appended claims.

We claim as our invention:

1. In a method for manufacturing a layer of glass on an inner surface of a hollow body wherein a reactive gas mixture suitable for glass synthesis is introduced into a hot region within said hollow body and generated by exterior heating of said hollow body, with such reactive gas undergoing a chemical reaction at such region so that a material having the composition of glass is deposited on the inner surface of said hollow body as a layer which is melted into a clear glass film in the hot region, the improvement comprising wherein:

a combustible heating gas mixture is admixed with said reactive gas mixture and the resultant gas admixture is introduced into said hot region within said hollow body, said combustible gas mixture igniting in said hot region and burning therein during said chemical reaction and layer melting.

2. In a method as defined in claim 1 wherein said combustible heating gas mixture is a hydrogen-free heating gas mixture.

3. In a method as defined in claim 2 wherein said heating gas mixture is an admixture of a gas selected from the group consisting of CO, $C_2N_2$, $CS_2$, COS and mixtures thereof, and $O_2$.

4. In a method as defined in claim 1 wherein said heating gas mixture includes a halide and a hydrogen-containing gas which during combustion yields a hydrogen halide, instead of water.

5. In a method as defined in claim 4 wherein said heating gas mixture includes at least one deuterated hydrocarbon gas for combustion.

6. In a method as defined in claim 5 wherein said deuterated hydrocarbon gas is selected from the group consisting of tetradeuteromethane, dideuteroazethlene and mixtures thereof.

7. In a method as defined in claim 1 wherein said heating gas mixture includes at least one dueterated hydrocarbon gas for combustion.

8. In a method as defined in claim 7 wherein said deuterated hydrocarbon gas is selected from the group consisting of tetradeuteromethane, dideuteroazethlene and mixtures thereof.

9. In a method as defined in claim 1 wherein said heating gas mixture includes a substance which functions as a flame inhibitor.

10. In a method as defined in claim 9 wherein said substance comprises a gaseous halide.

* * * * *